US010763106B2

(12) United States Patent
Ouchi et al.

(10) Patent No.: US 10,763,106 B2
(45) Date of Patent: Sep. 1, 2020

(54) METHOD FOR PROCESSING WORKPIECE (71) Applicant: TOKYO ELECTRON LIMITED, Tokyo (JP)

(72) Inventors: Kenji Ouchi, Nirasaki (JP); Masato Morishima, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/310,520

(22) PCT Filed: Jun. 15, 2017

(86) PCT No.: PCT/JP2017/022156
§ 371 (c)(1),
(2) Date: Dec. 17, 2018

(87) PCT Pub. No.: WO2017/221808
PCT Pub. Date: Dec. 28, 2017

(65) Prior Publication Data
US 2019/0189437 A1 Jun. 20, 2019

(30) Foreign Application Priority Data
Jun. 20, 2016 (JP) ................. 2016-121826

(51) Int. Cl.
H01L 21/02 (2006.01)
C23C 16/42 (2006.01)
(Continued)

(52) U.S. Cl.
CPC ........ H01L 21/02274 (2013.01); C23C 16/30 (2013.01); C23C 16/42 (2013.01);
(Continued)

(58) Field of Classification Search
CPC ... C23C 16/30; C23C 16/42; C23C 16/45523; C23C 16/50; C23C 16/56;
(Continued)

(56) References Cited

U.S. PATENT DOCUMENTS

2015/0259795 A1* 9/2015 Hirose ............... C23C 16/30
118/704
2015/0368802 A1* 12/2015 Yamada ............. C23C 16/345
427/579
2016/0163557 A1* 6/2016 Hudson ........... H01L 21/30655
438/696

FOREIGN PATENT DOCUMENTS

JP   H08-045857 A   2/1996
JP   H10-340900 A   12/1998
(Continued)

OTHER PUBLICATIONS

International Search Report issued in PCT/JP2017/022156; dated Sep. 12, 2017.

Primary Examiner — Lan Vinh
(74) Attorney, Agent, or Firm — Studebaker & Brackett PC (57) ABSTRACT In one embodiment in which a technology which is capable of reducing voids that can occur when burying an insulating film into a trench while suppressing process complication, a method MT for processing a wafer W is provided. The wafer W has a groove 62 formed on the main surface 61 of the wafer W. The method MT includes: step S1 of accommodating the wafer W in a processing chamber 4 of a plasma processing apparatus 10; step S2 of starting supplying a first gas into the processing chamber 4; step S3 of starting supplying plasma generation high-frequency power into the processing chamber 4; and step S4 of starting intermittent supplying a second gas into the processing chamber 4 and starting supplying a third gas into the processing chamber 4
(Continued)

together, the first gas is a nitrogen-containing gas, the second gas is a gas that does not contain halogen, and the third gas is a gas that contains halogen.

18 Claims, 4 Drawing Sheets

(51) Int. Cl.
| | |
|---|---|
| C23C 16/30 | (2006.01) |
| C23C 16/455 | (2006.01) |
| C23C 16/50 | (2006.01) |
| C23C 16/56 | (2006.01) |
| H01J 37/32 | (2006.01) |
| H01L 21/311 | (2006.01) |

(52) U.S. Cl.
CPC ........ *C23C 16/45523* (2013.01); *C23C 16/50* (2013.01); *C23C 16/56* (2013.01); *H01J 37/321* (2013.01); *H01J 37/3244* (2013.01); *H01L 21/0217* (2013.01); *H01L 21/0228* (2013.01); *H01L 21/02211* (2013.01); *H01L 21/31116* (2013.01); *H01J 2237/334* (2013.01); *H01J 2237/3321* (2013.01)

(58) Field of Classification Search
CPC ......... H01J 2237/3321; H01J 2237/334; H01J 37/321; H01J 37/3244; H01L 21/0217; H01L 21/02211; H01L 21/02274; H01L 21/0228; H01L 21/31116
USPC ....... 438/706, 710, 712, 714, 719, 723, 736, 438/780, 700
See application file for complete search history.

(56) References Cited

FOREIGN PATENT DOCUMENTS

| | | |
|---|---|---|
| JP | 2000-306992 A | 11/2000 |
| JP | 2005-166911 A | 6/2005 |
| JP | 2007-042819 A | 2/2007 |

* cited by examiner

METHOD FOR PROCESSING WORKPIECE

TECHNICAL FIELD

An embodiment of the present invention relates to a method for processing a workpiece.

BACKGROUND ART

In accordance with miniaturization of semiconductors, the density of a wiring pattern increases, and the width of trenches (grooves) of the pattern also becomes narrower. Technologies for filling the trench with an insulating film have been developed from the related art (for example, the technology disclosed in Patent Document 1 and the like).

The technology disclosed in Patent Document 1 is a technology aiming at manufacturing a semiconductor device which employs an STI separation method such that voids (gaps) do not remain and no damage is left on a silicon substrate even in a groove having an extremely narrow width and a high aspect ratio. In the technology, in the groove fainted on the silicon substrate, a Si-rich silicon oxide film ($SiO_XC_Y$ film, X<2) containing carbon is deposited to be thicker than a depth of the groove by a bias type high-density plasma chemical vapor deposition method (CVD), the Si-rich silicon oxide film is changed to a $SiO_2$ film while eliminating the voids on the inside of the Si-rich silicon oxide film by performing heat treatment in an oxidizing atmosphere, and then, flattening is performed by a chemical mechanical polishing (CMP) method.

CITATION LIST

Patent Document

[Patent Document 1] Japanese Unexamined Patent Publication No. 2000-306992

SUMMARY OF INVENTION

Technical Problem

A technology according to Patent Document 1 reduces voids by performing heat treatment after forming an insulating film in a groove in a state where voids are included. However, it is difficult to sufficiently remove already formed voids from the insulating film only by the heat treatment. In addition, there is a case where a wafer is affected by heat caused by the heat treatment for a long period of time, and further, a manufacturing process can become complicated in accordance with this kind of the heat treatment. Therefore, it is desired to realize a technology which is capable of reducing voids that can be generated when the insulating film is buried in the trench while suppressing process complication.

Solution to Problem

According to an aspect, there is provided a method for processing a workpiece. On the main surface of the workpiece, a groove is formed. The method includes: (a) a first step of accommodating the workpiece in a processing chamber of a plasma processing apparatus; (b) a second step of starting supplying a first gas into the processing chamber after the first step; (c) a third step of starting supplying plasma generation high-frequency power into the processing chamber after the second step; and (d) a fourth step of starting intermittent supplying a second gas into the processing chamber and starting supplying a third gas into the processing chamber together, after the third step. The first gas is a gas that contains nitrogen, the second gas is a gas that does not contain halogen, and the third gas is a gas that contains halogen.

In the embodiment, the plasma of the second gas generated by the plasma generation high-frequency power includes deposition species.

In the embodiment, the plasma of the third gas generated by the plasma generation high-frequency power includes etching species. In this manner, since the plasma of the third gas contains the etching species, the film generated on the side wall of the groove can be removed.

In the embodiment, the second gas may be a silane-based gas and the second gas may be a $SiH_4$ gas.

In the embodiment, the third gas may be a gas that contains fluorine and the third gas may be a $SiF_4$ gas.

In the embodiment, the method further includes: a fifth step of terminating supplying of the second gas started in the fourth step while continuing supplying of the first gas started in the second step, supplying of the plasma generation high-frequency power started in the third step, and supplying of the third gas started in the fourth step, after the fourth step; and a sixth step of terminating the supplying of the plasma generation high-frequency power started in the third step while continuing the supplying of the first gas started in the second step and the supplying of the third gas started in the fourth step, after the fifth step.

In the embodiment, at the same time as the supplying of the plasma generation high-frequency power is started, the third step further starts the application of the ion drawing bias power to the placing table that supports the workpiece. In addition, the groove of the workpiece extends substantially in a vertical direction with respect to the main surface from the main surface of the workpiece.

Advantageous Effects of Invention

According to the above-described embodiment, there is provided a technology which is capable of reducing voids that can be generated at the time of burying an insulating film into a trench while suppressing process complication.

BRIEF DESCRIPTION OF DRAWINGS

FIG. 3 includes a part (a) and a part (b), a part (a) in FIG. 3 is a sectional view schematically illustrating a state of a workpiece before execution of each step of the method illustrated in FIG. 1, and a part (b) in FIG. 3 is a sectional view schematically illustrating a state of the workpiece after the execution of each step of the method illustrated in FIG. 1.

DESCRIPTION OF EMBODIMENTS

Figure 1:
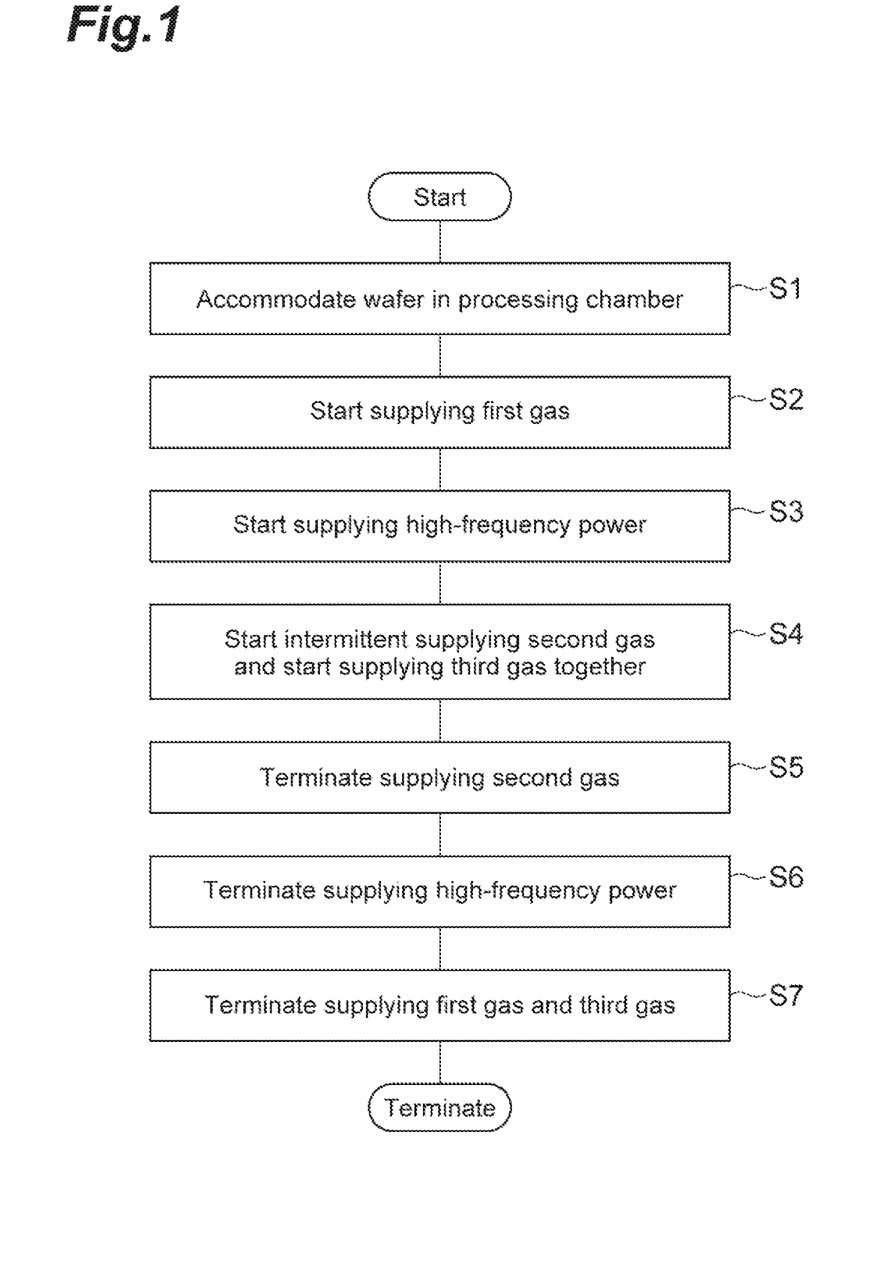
FIG. 1 is a flowchart illustrating a method according to an embodiment.

Hereinafter, various embodiments will be described in detail with reference to the accompanying drawings. In addition, the same or equivalent parts in the drawings are denoted by the same reference numerals. FIG. 1 is a flowchart illustrating a method of an embodiment. A method MT of the embodiment illustrated in FIG. 1 is a method of processing a workpiece (hereinafter, may be referred to as "wafer" in some cases). In addition, in the method MT of the embodiment, it is possible to execute a series of steps using a single plasma processing apparatus.

Figure 2:
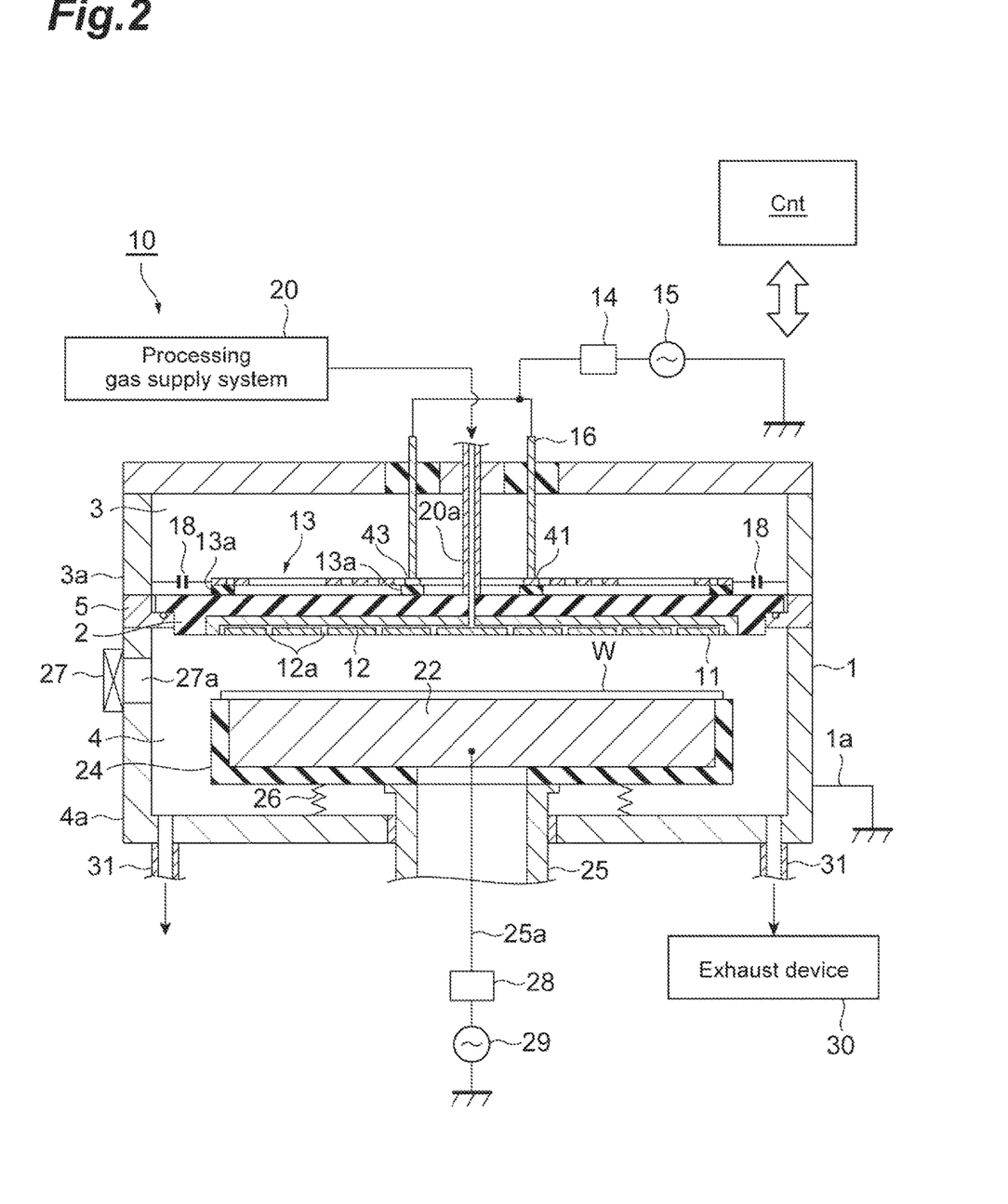
FIG. 2 is a sectional view illustrating an example of a plasma processing apparatus which implements the method illustrated in FIG. 1.

FIG. 2 is a view illustrating an example of the plasma processing apparatus. FIG. 2 schematically illustrates a sectional structure of a plasma processing apparatus 10 that can be used in various embodiments of the method for processing a workpiece. As illustrated in FIG. 2, the plasma processing apparatus 10 is an inductively coupled plasma etching apparatus.

The plasma processing apparatus 10 includes a processing container 1. The processing container 1 is airtightly provided. The processing container 1 includes a conductive material, and for example, an inner wall surface of the processing container 1 may include a material, such as anodized aluminum. The processing container 1 is assembled in a disassemblable manner and is grounded by a ground wire 1a. The processing container 1 is partitioned into an antenna chamber 3 and a processing chamber 4 vertically by a dielectric wall 2. The dielectric wall 2 configures a ceiling wall of the processing chamber 4. The dielectric wall 2 is configured of ceramics, such as $Al_2O_3$, or quartz.

A shower housing 11 for supplying processing gas is fitted into a lower part of the dielectric wall 2. The shower housing 11 is provided in a cross shape and supports the dielectric wall 2 from below. The shower housing 11 which supports the dielectric wall 2 is suspended from the ceiling of the processing container 1 by a plurality of suspenders (not illustrated).

The shower housing 11 can include a conductive material, such as a metal. The inner surface of the shower housing 11 can contain, for example, anodized aluminum and the like, so as not to generate contaminants A gas flow path 12 that extends along the dielectric wall 2 is formed in the shower housing 11, and a plurality of gas supply holes 12a that extend toward a susceptor 22 communicate with the gas flow path 12. At the center of the upper surface of the dielectric wall 2, a gas supply pipe 20a is provided so as to communicate with the gas flow path 12. The gas supply pipe 20a extends from the dielectric wall 2 to the outside of the processing container 1 and is connected to a processing gas supply system 20 including a processing gas supply source, a valve system and the like. In the plasma processing, the processing gas supplied from the processing gas supply system 20 is supplied into the shower housing 11 via the gas supply pipe 20a, and is discharged from the gas supply hole 12a of the lower surface (the surface facing the processing chamber 4) of the shower housing 11 to the inside of the processing chamber 4.

A supporting shelf 5 which protrudes inward is provided between a side wall 3a of the antenna chamber 3 and a side wall 4a of the processing chamber 4 in the processing container 1, and the dielectric wall 2 is placed on the supporting shelf 5.

In the antenna chamber 3, a high-frequency antenna 13 is disposed on the dielectric wall 2, so as to face the dielectric wall 2. The high-frequency antenna 13 is separated from the dielectric wall 2 by a spacer 13a configured of an insulating member in a range of, for example, 50 mm or less. Four power supply members 16 that extend in a direction (in the vertical direction) perpendicular to the upper surface of the dielectric wall 2 are provided in the vicinity of the central portion of the antenna chamber 3, and a high-frequency power source 15 is connected to the four power supply members 16 via a matching unit 14. The power supply member 16 is disposed around the gas supply pipe 20a.

During plasma processing, plasma generation high-frequency power having a frequency of, for example, approximately 13.56 [MHz] for induction electric field formation is supplied from the high-frequency power source 15 into the processing chamber 4 via the high-frequency antenna 13. In this manner, by supplying the plasma generation high-frequency power from the high-frequency power source 15 into the processing chamber 4, an induction electric field is formed in the processing chamber 4, and the plasma of the processing gas to be supplied into the processing chamber 4 from the shower housing 11 is generated with the induction electric field. In addition, the shower housing 11 is provided in a cross shape, and supplying of the high-frequency power from the high-frequency antenna 13 into the processing chamber 4 is not disturbed even when the shower housing 11 is a metal.

The susceptor 22 (placing table) is provided below the processing chamber 4 (the side opposite the dielectric wall 2) so as to face the high-frequency antenna 13 with the dielectric wall 2 interposed therebetween. The wafer W which is as the workpiece is placed on the susceptor 22. The susceptor 22 can contain a conductive material. The surface of the susceptor 22 can contain, for example, anodized or alumina sprayed aluminum. The wafer W placed on the susceptor 22 is adsorbed and held by the susceptor 22 by an electrostatic chuck (not illustrated).

The susceptor 22 is accommodated in an insulating frame 24 and is supported by a support 25. The support 25 has a hollow structure. Between the insulating frame 24 which accommodates the susceptor 22 and the bottom portion of the processing container 1 (the side of the processing container 1 on which the support 25 is provided), a bellows 26 airtightly surrounding the support 25 is disposed. The side wall 4a of the processing chamber 4 is provided with a carrying in-out port 27a for carrying in and out the wafer W and a gate valve 27 for opening and closing the carrying in-out port 27a.

The susceptor 22 is connected to a high-frequency power source 29 via a matching unit 28 by a power supply rod 25a provided in the support 25. During the plasma processing, the high-frequency power source 29 applies bias high-frequency power, for example, bias high-frequency power having a frequency of approximately 400 [kHz] to 6 [MHz] to the susceptor 22. With the bias high-frequency power, ions in the plasma generated in the processing chamber 4 can be effectively drawn into the wafer W.

In the susceptor 22, in order to control the temperature of the wafer W, a temperature control mechanism including heating means, such as a ceramic heater, a refrigerant flow path and the like, and a temperature sensor are provided (none of these are illustrated). All of the piping or wiring for the mechanisms or members are led out of the processing container 1 through the inside of the support 25.

An exhaust device 30 including a vacuum pump and the like is connected to the bottom portion of the processing chamber 4 (the side of the processing chamber 4 on which the support 25 is provided) via an exhaust pipe 31. The processing chamber 4 is exhausted by the exhaust device 30, the inside of the processing chamber 4 is set and maintained in a predetermined vacuum atmosphere (for example, an air pressure of approximately 1.33 [Pa]) during the plasma processing.

The high-frequency antenna 13 has four power supply units (for example, a power supply unit 41, a power supply unit 43, and the like). The four power supply units are connected to the power supply member 16. The four power supply units are disposed, for example, approximately 90 degrees apart from each other around the center of the high-frequency antenna 13. Two antenna wirings extend outward from each of the four power supply units, and each of the antenna wirings is grounded via a capacitor 18.

The plasma processing apparatus 10 includes a control unit Cnt. The control unit Cnt is a computer including a processor, a storage unit, an input device, a display device and the like, and controls each unit of the plasma processing apparatus 10.

The control unit Cnt operates according to a program based on the input recipe and sends out a control signal. Based on the control signal from the control unit Cnt, it is possible to control the selection and a flow rate of the gas supplied from the processing gas supply system 20, the exhaust of the exhaust device 30, the power supply from the high-frequency power source 15 and the high-frequency power source 29, and the temperature of the susceptor 22. In addition, each step (steps S1 to S7 illustrated in FIG. 1) of the method (method MT) for processing the workpiece disclosed in the present specification can be executed by operating each unit of the plasma processing apparatus 10 under the control by the control unit Cnt.

Figure 3:
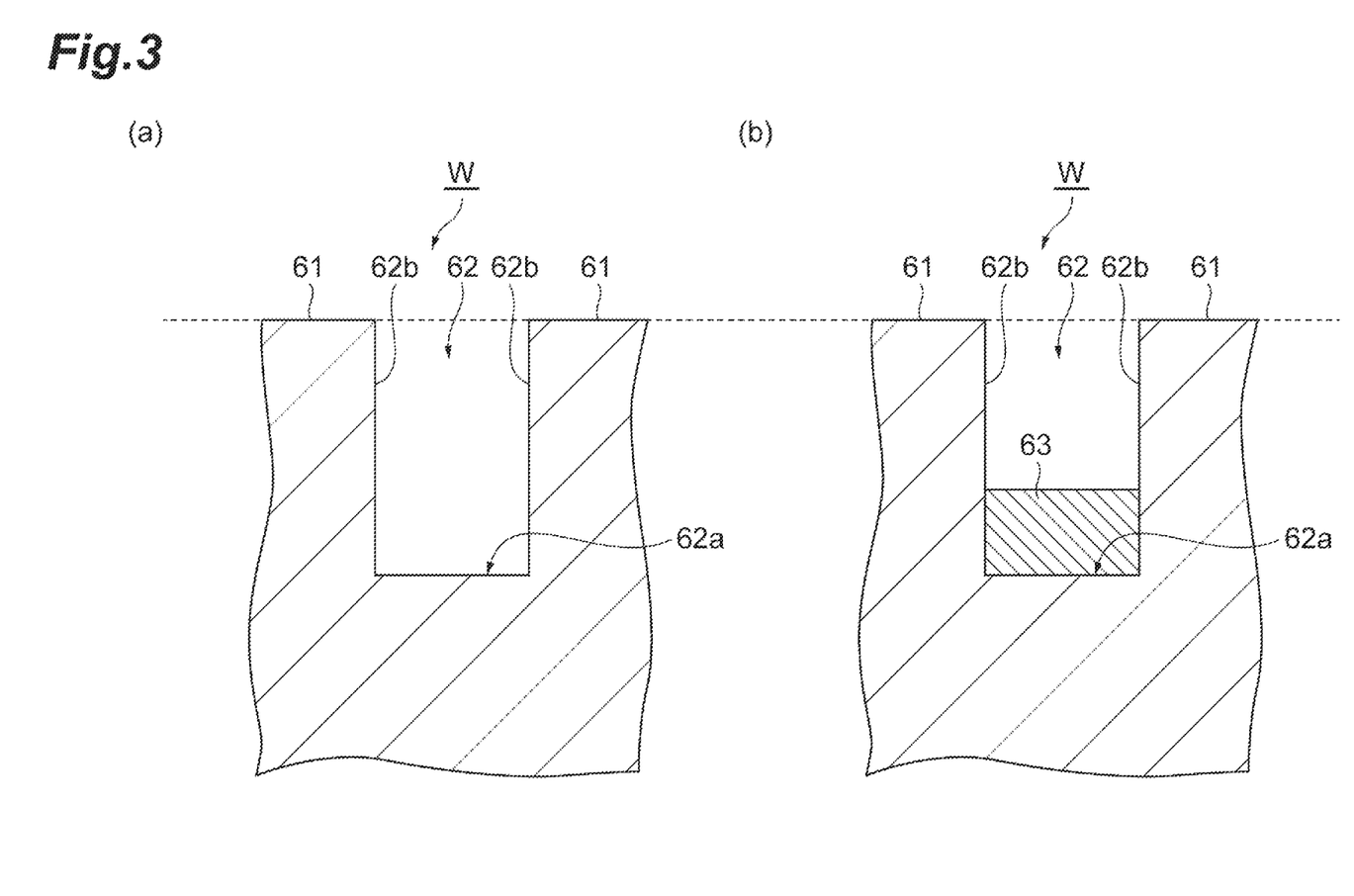
Figure 4:
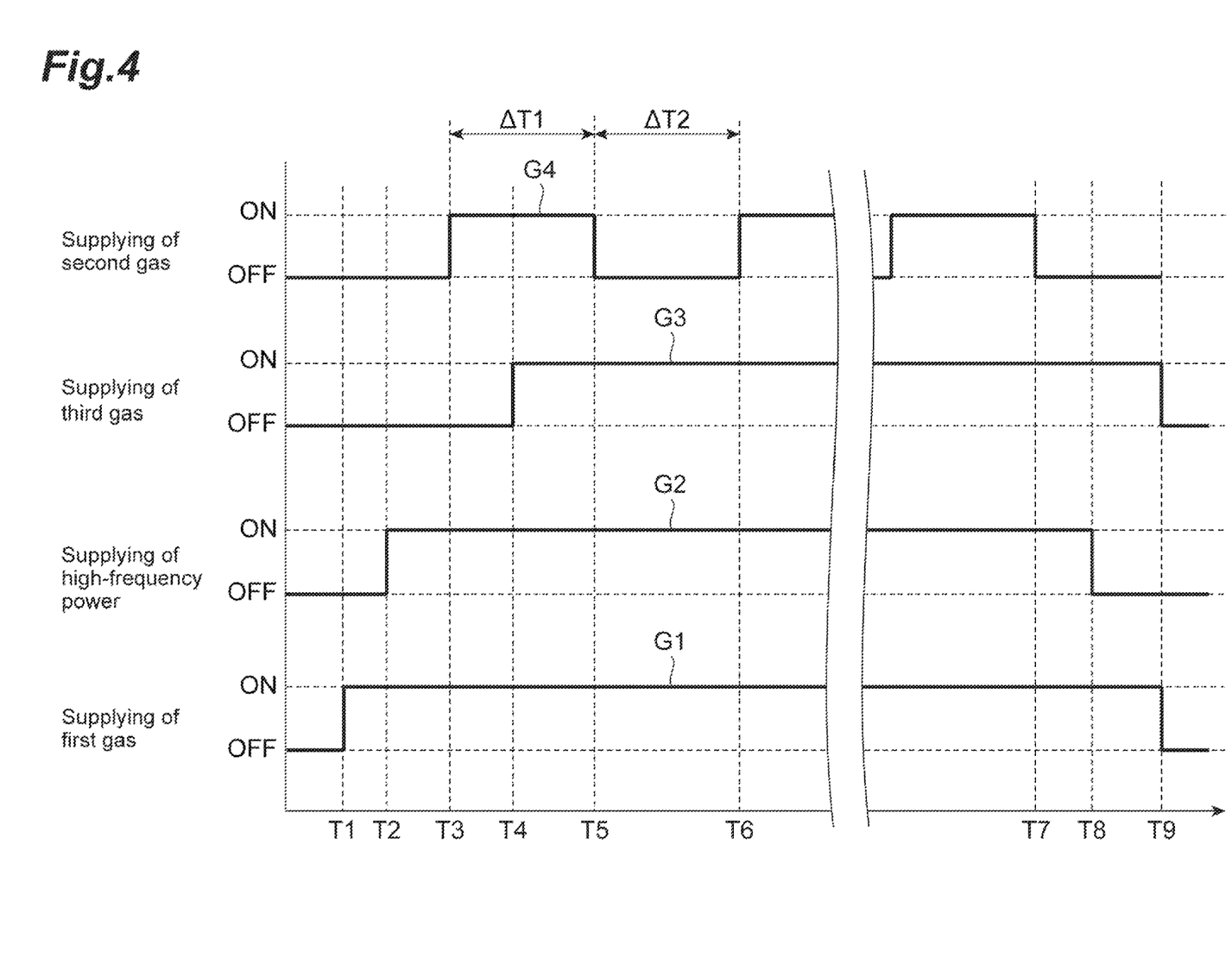
FIG. 4 is a view illustrating execution timings of various types of processing implemented in each step of the method illustrated in FIG. 1.

With reference to FIG. 1 again, the method MT will be described in detail. Hereinafter, an example in which the plasma processing apparatus 10 is used in implementation of the method MT will be described. In addition, in the following description, a part (a) of FIG. 3, a part (b) of FIG. 3, and FIG. 4 will be referred to. The part (a) of FIG. 3 is a sectional view schematically illustrating the state of the workpiece before execution of each of the steps of the method MT illustrated in FIG. 1. The part (b) of FIG. 3 is a sectional view schematically illustrating the state of the workpiece after execution of each of the steps of the method illustrated in FIG. 1. FIG. 4 is a view illustrating execution timings of various types of processing implemented in each of the steps of the method MT illustrated in FIG. 1.

The method MT illustrated in FIG. 1 includes steps S1 to S7 as main steps of the method MT. In step S1 (first step), the wafer W is accommodated in the processing chamber 4 of the processing container 1 of the plasma processing apparatus 10. As illustrated in the part (a) of FIG. 3, the wafer W accommodated in the processing chamber 4 in step S1 includes a main surface 61. The wafer W includes one or a plurality of grooves 62. The groove 62 is formed on the main surface 61. The groove 62 includes a bottom portion 62a and a side wall 62b. The groove 62 extends from the main surface 61 of the wafer W in a direction substantially perpendicular to the main surface 61. In the wafer W, the material having a configuration (the bottom portion 62a and the side wall 62b) that defines the groove 62 is, for example, silicon or the like.

Following step S1, step S2 (second process) starts supplying a first gas into the processing chamber 4. Specifically, supplying of the first gas into the processing chamber 4 is started, and accordingly, the pressure in the processing chamber 4 can be adjusted to a value appropriate for forming the plasma. As illustrated in a graph G1 of FIG. 4, in step S2, the supplying of the first gas into the processing chamber 4 is started at time T1 (the supplying of the first gas is changed from OFF to ON). The graph G1 illustrates the start timing and the end timing of the supplying of the first gas into the processing chamber 4 in the method MT. The supplying of the first gas into the processing chamber 4 is continued until time T9 after passing through time T8. Time T8 is the time after time T1. The first gas is a nitrogen-containing gas and can be, for example, nitrogen gas ($N_2$ gas), ammonia ($NH_3$), nitrogen oxide (NO, $NO_2$). Time T9 can be a timing to terminate (OFF) the supplying of the first gas and the third gas.

Following step S2, in step S3 (third step) and step S4 (fourth step), using the plasma chemical vapor deposition (CVD), by adjusting the type of gas used for plasma and the supply timing of the type of gas, a film 63 is selectively formed in a bottom portion 62a of the groove 62 such that no film is deposited on the side wall 62b of the groove 62.

In step S3, supplying of the plasma generation high-frequency power into the processing chamber 4 is started. As illustrated in a graph G2 of FIG. 4, in step S3, at time T2, the supplying of the plasma generation high-frequency power into the processing chamber 4 is started (the supplying of the plasma generation high-frequency power is changed from OFF to ON). The graph G2 illustrates the start timing and the end timing of the supplying of the plasma generation high-frequency power into the processing chamber 4 in the method MT. The supplying of the plasma generation high-frequency power into the processing chamber 4 is continued until reaching the time T8. The plasma generation high-frequency power supplied into the processing chamber 4 can be constant or can change during the supply. Time T2 is the time after time T1 and before time T8.

From step S3 to step S6 which will be described later (step of terminating the supplying of the plasma generation high-frequency power), the supplying of the plasma generation high-frequency power is started and the application of the ion drawing bias power to the susceptor 22 (placing table) for supporting the wafer W is started. Accordingly, in steps S3 to S6, the ions contained in the plasma of the first gas, the ions contained in the plasma of the second gas, and the ions contained in the plasma of the third gas are anisotropically irradiated toward the bottom portion 62a of the groove 62. The ion drawing bias power can be a bias high-frequency power supplied from the high-frequency power source 29, but not being limited thereto, and can be a direct current power, such as a pulse direct current power that can be supplied from a direct current power source (not illustrated). Here, the groove 62 extends from the main surface 61 of the wafer W in a direction substantially perpendicular to the main surface 61, but since the wafer W is placed substantially horizontally on the susceptor 22 (placing table), ions that are drawn by the bias power applied to the susceptor 22 are irradiated substantially perpendicularly to the wafer W, and thus, the ions are anisotropically irradiated toward the bottom portion of the groove 62.

Following step S3, in step S4, intermittent supplying the second gas into the processing chamber 4 is started and supplying the third gas into the processing chamber 4 is started. As illustrated in the graphs G3 and G4 in FIG. 4, in step S4, at time T3, an intermittent supplying of the second gas into the processing chamber 4 is started (the supplying of the second gas is changed from OFF to ON, and further, ON and OFF are alternately repeated), and at time T4, supplying of the third gas into the processing chamber 4 is started (the supplying of the third gas is changed from OFF to ON). The graph G3 illustrates the start timing and the end timing of the supplying of the third gas into the processing chamber 4 in the method MT. The graph G4 illustrates the start timing and the end timing of the intermittent supplying of the second gas into the processing chamber 4 in the method MT. The intermittent supplying of the second gas into the processing chamber 4 is continued until time T7. The supplying of the third gas into the processing chamber 4 is continued until reaching time T9 after passing through time T8. Time T3 and time T4 are the time after time T2 and before time T7. Time T3 is a time before time T4 or at the same time as time T4 (T3≤T4). Time T7 is the time before time T8.

As illustrated in the graph G4 of FIG. 4, the second gas is intermittently supplied into the processing chamber 4. For example, the supplying of the second gas can be alternately repeated between ON and OFF periodically. For the supplying of the second gas, the ON period ΔT1 is, for example, ΔT1=T5−T3, and for the supplying of the second gas, the OFF period ΔT2 is, for example, ΔT2=T6−T5. Time T5 and time T6 are the time after time T4 and before time T7. Time T5 is the time before time T6. Each of the values of the periods ΔT1 and ΔT2 can be controlled to a constant value until reaching the time T7 when the supplying of the second gas is terminated, but can also be controlled to change. Each of the values of the periods ΔT1 and ΔT2, a degree of change in each of the values of the periods ΔT1 and ΔT2, ratio of the value of the period ΔT1 and the value of the period ΔT2, and a degree of change in ratio of the value of the period ΔT1 and the value of the period ΔT2, are controlled such that the film 63 is deposited in the bottom portion 62a of the groove 62 while sufficiently suppressing the deposition of the film on the side wall 62b of the groove 62.

For example, ΔT1 is 0.1 to 10 [s], ΔT2 is 0.1 to 30 [s], and the ratio (ΔT1/ΔT2) of ΔT1 and ΔT2 can be 1 to 3. The value of the period ΔT1 and the value of the period ΔT2 which are described above can also change depending on the parameters (high-frequency power, bias power, gas flow rate, pressure, and temperature) that affect the deposition of the film, but by optimally controlling the parameters, it becomes possible to deposit the film 63 only in the bottom portion 62a of the groove 62 while sufficiently suppressing the deposition of the film on the side wall 62b of the groove 62.

The number of repetitions of turning on and off the supplying of the second gas is determined in accordance with the thickness of the film 63 formed in the groove 62, and as the number of repetitions of turning on and off the supplying of the second gas increases, the thickness of the film 63 formed in the groove 62 increases. The supply timing of the third gas is the same as the supply timing of the second gas or after the supply timing of the second gas. In a case where the supply timing of the third gas is later than the supply timing of the second gas, the delay time (a difference between the supply timing of the third gas and the supply timing of the second gas, for example, from time T3 until reaching time T4) is equal to the period ΔT1 at most.

In step S4, the plasma of the second gas generated by the plasma generation high-frequency power includes deposition species. The second gas is a gas that does not contain halogen. The second gas is a silane-based gas, and particularly, can be a $SiH_4$ gas. In step S4, the plasma of the third gas generated by the plasma generation high-frequency power includes etching species. The third gas is a gas that contains halogen. The third gas is a gas that contains fluorine, and particularly, can be a $SiF_4$ gas.

Following step S4, in step S5 (fifth step), the supplying of the first gas started in step S2, the supplying of the plasma generation high-frequency power started in step S3, and the supplying of the third gas started in step S4, are continued, and the intermittent supplying of the second gas started in step S4 is terminated. As illustrated in the graph G4 of FIG. 4, in step S5, at time T7, the intermittent supplying of the second gas is terminated (the supplying of the second gas is maintained to be OFF). At the time T7, the supplying of the first gas, the supplying of the plasma generation high-frequency power, and the supplying of the third gas are continued. After time T7, the value of the period ΔT3 during which the supplying of the first gas, the supplying of the third gas, and the supplying of the plasma generation high-frequency power are continued, is the value (t8−t7) obtained by subtracting the value (t7) at time T7 from the value (t8) at time T8. The value of the period ΔT3 can be set to be the same as the time from the start time of the first supplying of the second gas (time T3) until reaching the start time of the supplying of the third gas (time T4). In other words, assuming that the value at time T3 is t3 and the value at the time T4 is t4, the value of the period ΔT3 can be set to be the same as the value (t4−t3) obtained by subtracting the value t3 at time T3 from the value (t4) at time T4. In this case, the maximum value of ΔT3 can be set to be the same as ΔT1.

Following step S5, in step S6 (sixth step), while continuing the supplying of the first gas started in step S2 and the supplying of the third gas started in step S4, the supplying of the plasma generation high-frequency power started in step S3 is terminated. As illustrated in the graph G2 of FIG. 4, in step S6, at time T8, the supplying of the plasma generation high-frequency power is terminated (the supplying of the plasma generation high-frequency power is maintained to be OFF). At time T8, the supplying of the second gas has already been terminated, but the supplying of the first gas and the supplying of the third gas are continued. In addition, in step S6, the supplying of the plasma generation high-frequency power is terminated, and at the same time, the application of the ion drawing bias power started in step S3 is terminated.

Following step S6, in step S7, as illustrated in the graphs G1 and G3 in FIG. 4, at time T9 after time T8, the supplying of the first gas and the supplying of the third gas are terminated (after time T9, the supplying of the first gas and the supplying of the third gas are maintained to be OFF).

As illustrated in the part (b) of FIG. 3, according to the above-described method MT, the film 63 can be formed excellently without voids in the groove 62. Since nitrogen gas (first gas) is used for forming the film 63, the film 63 is a nitride film that contains nitrogen. In addition, although the film can also be formed at the part between the grooves 62 on the main surface 61 by the method MT, the film does not affect each step of the present invention or the insulating film buried in the groove 62. The film formed at the part between the grooves 62 on the main surface 61 is removed by the chemical mechanical polishing method (CMP) in a later step. The part (b) of FIG. 3 illustrates a state of the groove 62 after the film formed on the main surface 61 is removed by the CMP method or the like.

According to the method MT of the embodiment described above, at least the following effects can be obtained as an example. First, in a case of forming the film 63 in the groove 62 of the wafer W using the plasma of the third gas that contains halogen together with the plasma of the nitrogen gas, the side wall 62b of the groove 62 can be scraped by the halogen contained in the third gas while the film 63 is formed in the bottom portion 62a of the groove 62, but as a result of earnest research, the inventors have found that etching on the side wall 62b of the groove 62 due to halogen contained in the third gas is suppressed by applying the plasma of the second gas that does not contain halogen, and further, the deposition of the film on the side wall 62b of the groove 62 by the second gas can also be suppressed by the halogen contained in the third gas. In a case where a film is deposited on the side wall 62b of the groove 62, the film formed in the groove 62 by bonding or the like the film deposited on the side wall 62b of the groove 62 and the film deposited in the bottom portion 62a of the groove 62 can include the voids accompanying with the growth of the film, but by using the present method, process complication does not occur, and by adjusting the type of gas used for plasma and the supply timing of the type of gas, the film 63 can be deposited in the bottom portion 62a of the groove 62 while sufficiently suppressing the deposition of the film on the side wall 62b of the groove 62, and thus, the film 63 can be excellently formed without the voids on the inside of the groove 62. Further, by intermittently supplying the second gas, a protective film which are necessary and sufficient to protect the side wall 62b of the groove 62 from the etching by halogen contained in the third gas can be generated on the side wall 62b of the groove 62, while suppressing the deposition of the film on the side wall 62b of the groove 62 by the second gas, and thus, without deposition of the film on the side wall 62b of the groove 62 and without etching to the side wall 62b of the groove 62, the film 63 can be excellently deposited without the voids in the bottom portion 62a of the groove 62.

Furthermore, since the plasma of the second gas contains the deposition species, the protective film against the halogen contained in the third gas can be generated on the side wall 62b of the groove 62. Since the plasma of the third gas contains the etching species, the film generated on the side wall 62b of the groove 62 can be removed. Since the second gas is a silane-based gas, particularly, a SiH$_4$ gas, the plasma of the second gas can include deposition species. Since the third gas is a gas that contains fluorine, particularly, a SiF$_4$ gas, the plasma of the third gas can include etching species.

Furthermore, according to step S5 and step S6, in a state where the supplying of the first gas and the supplying of the third gas are continued, the supplying of the second gas and the supplying of the plasma generation high-frequency power are terminated. Thus, the generation of the film is terminated after step S6, but even in a case where the film is in a state of being deposited on the side wall 62b of the groove 62, the film can be removed by halogen contained in the third gas which is intermittently supplied. In addition, since the third gas is used in a state other than the plasma after step S6, the effect of etching by the halogen of the third gas is suppressed, and accordingly, the etching with respect to the film by the third gas can be smoothly performed.

Furthermore, since ion drawing bias power is applied to the susceptor 22 (placing table) for supporting the wafer W, the ions in the plasma can excellently reach the bottom portion 62a of the groove 62 along the groove 62 from the main surface 61 of the wafer W. Therefore, irregularities that can occur on the surface of the film 63 (nitride film) formed in the bottom portion 62a of the groove 62 can be sufficiently reduced, and accordingly, the surface of the film 63 formed in the bottom portion 62a of the groove 62 can be relatively uniform and flat.

In addition, halogen separated in the plasma contained in the third gas serves as a radical etching species and isotropically etches the film. Deposition species contributing to the film formation can also be generated from the third gas together with radical etching species. The deposition species generated from the third gas include radical deposition species and ionic deposition species. The radical deposition species contribute isotropically to the film formation. The ionic deposition species are also affected by the bias and can anisotropically contribute to the film formation further in the bottom portion 62a. Generally, a large amount of radical etching species can be generated, but regarding the deposition species, there are many ionic deposition species and few radical deposition species, and thus, the film formation in the bottom portion 62a of the groove 62 can occur, but etching is further promoted on the side wall 62b and the side wall 62b can be etched excessively. Meanwhile, in a case of the second gas, halogen is not contained in the plasma of the second gas, and thus, the etching species are not generated and the radical deposition species and the ionic deposition species are generated. The radical deposition species contribute isotropically to the film formation. Since the ionic deposition species are also affected by the bias and anisotropically contribute to the film formation, the film is likely to be deposited further in the bottom portion 62a. However, by controlling the amount of the second gas having no halogen independently from the third gas, the film formation of the side wall 62b can be promoted at the same time as the film formation of the bottom portion 62a, and thus, it becomes possible to perform the film formation in the bottom portion 62a of the groove 62 while suppressing excessive etching of the side wall 62b. Based on the description above, the intermittent supplying of the second gas that does not contain halogen is performed. In a case where the film formation of the side wall 62b becomes excessive, it becomes possible to suppress the film formation by adjusting the amount of the second gas. The adjustment can be performed based on each value of the period ΔT1 and the period ΔT2 and the ratio of the value of the period ΔT1 and the value of the period ΔT2.

Example 1

Step S4 can be implemented under the following condition, for example.

Value [Pa] of pressure in processing chamber 4: 0.1 to 10 [Pa]

Value [MHz] of the frequency of high-frequency power source 15 and value [watt] of high-frequency power: 13.56 [MHz], 100 to 5000 [watt]

Value [MHz] of frequency of high-frequency power source 29 and value [watt] of bias power: 0.1 to 6 [MHz], 100 to 1000 [watt]

Processing gas: N$_2$ gas (first gas), SiH$_4$ gas (second gas), SiF$_4$ gas (third gas)

Flow rate [scan] of processing gas: (N$_2$ gas) 1 to 500 [sccm], (SiH$_4$ gas) 1 to 300 [sccm], (SiF$_4$ gas) 1 to 100 [sccm]

ON time [s] and OFF time [s] of supplying of second gas time: (ON time) 0.1 to 10 [s], (OFF time) 0.1 to 30 [s]

In addition, the number of repetitions of turning ON and OFF of the supplying of the second gas and the total processing time (the time from time T1 until reaching time T9 which is the execution time of the method MT) can be determined by various factors, such as a burying pattern (shape of groove 62) or burying thickness (depth of groove 62) of the film 63.

The principle of the present invention has been illustrated and described above in the preferable embodiments, but it is recognized by a person skilled in the art that the present invention can be modified in arrangements and details without deviating from such a principle. The present invention is not limited to the specific configuration disclosed in the present embodiment. Accordingly, a right to make all amendments and changes that come from the scope of the claim and the scope of spirit is claimed.

REFERENCE SIGNS LIST

1 . . . PROCESSING CONTAINER; 10 . . . PLASMA PROCESSING APPARATUS; 11 . . . SHOWER HOUS-

ING; 12 ... GAS FLOW PATH; 12a ... GAS SUPPLY HOLE; 13 ... HIGH-FREQUENCY ANTENNA; 13a ... SPACER; 14 ... MATCHING UNIT; 15 ... HIGH-FREQUENCY POWER SOURCE; 16 ... POWER SUPPLY MEMBER; 18 ... CAPACITOR; 1a ... GROUND WIRE; 2 ... DIELECTRIC WALL; 20 ... PROCESSING GAS SUPPLY SYSTEM; 20a ... GAS SUPPLY PIPE; 22 ... SUSCEPTOR; 24 ... INSULATING FRAME; 25 ... SUPPORT; 25a ... POWER SUPPLY ROD; 26 ... BELLOWS; 27 ... GATE VALVE; 27a ... CARRYING IN-OUT PORT; 28 ... MATCHING UNIT; 29 ... HIGH-FREQUENCY POWER SOURCE; 3 ... ANTENNA CHAMBER; 30 ... EXHAUST DEVICE; 31 ... EXHAUST PIPE; 3a ... SIDE WALL; 4 ... PROCESSING CHAMBER; 41 ... POWER SUPPLY UNIT; 43 ... POWER SUPPLY UNIT; 4a ... SIDE WALL; 5 ... SUPPORTING SHELF; 61 ... MAIN SURFACE; 62 ... GROOVE; 62a ... BOTTOM PORTION; 62b ... SIDE WALL; 63 ... FILM; Cnt ... CONTROL UNIT; MT ... METHOD; W ... WAFER.

The invention claimed is:

1. A method for processing a workpiece, on a main surface of which a groove is formed, the method comprising:
a first step of accommodating the workpiece in a processing chamber of a plasma processing apparatus;
a second step of starting supplying a first gas into the processing chamber after the first step;
a third step of starting supplying plasma generation high-frequency power into the processing chamber after the second step; and
a fourth step of starting intermittent supplying a second gas into the processing chamber and starting continuous supplying a third gas into the processing chamber together, after the third step,
wherein the first gas is a gas that contains nitrogen,
wherein the second gas is a gas that does not contain halogen, and
wherein the third gas is a gas that contains halogen.

2. The method according to claim 1,
wherein a plasma of the second gas generated by the plasma generation high-frequency power includes deposition species.

3. The method according to claim 1,
wherein a plasma of the third gas generated by the plasma generation high-frequency power includes etching species.

4. The method according to claim 1,
wherein the second gas is a silane-based gas.

5. The method according to claim 4,
wherein the second gas is a $SiH_4$ gas.

6. The method according to claim 1,
wherein the third gas is a gas that contains fluorine.

7. The method according to claim 6,
wherein the third gas is a $SiF_4$ gas.

8. The method according to claim 1, further comprising:
a fifth step of terminating supplying of the second gas started in the fourth step while continuing supplying of the first gas started in the second step, supplying of the plasma generation high-frequency power started in the third step, and supplying of the third gas started in the fourth step, after the fourth step; and
a sixth step of terminating the supplying of the plasma generation high-frequency power started in the third step while continuing the supplying of the first gas started in the second step and the supplying of the third gas started in the fourth step, after the fifth step.

9. The method according to claim 1,
wherein, in the third step, the supplying of the plasma generation high-frequency power and supplying ion drawing bias power to a placing table which supports the workpiece are started together, and
wherein the groove of the workpiece extends substantially in a vertical direction with respect to the main surface from the main surface of the workpiece.

10. An apparatus for processing a workpiece comprising:
a processing chamber provided to accommodate the workpiece;
a processing gas supply system provided to supply a first gas, a second gas and a third gas into the processing chamber, wherein the first gas contains nitrogen, the second gas does not contain halogen and the third gas contains halogen;
a high-frequency power source provided to supply a plasma generation high-frequency power into the processing chamber; and
a control unit,
wherein, on a main surface of the workpiece, a groove is formed,
wherein the control unit is provided to control the processing gas supply system and the high-frequency power source to execute:
a first step of accommodating the workpiece in a processing chamber;
a second step of starting supplying the first gas into the processing chamber after the first step;
a third step of starting supplying plasma generation high-frequency power into the processing chamber after the second step; and
a fourth step of starting intermittent supplying the second gas into the processing chamber and starting continuous supplying the third gas into the processing chamber together, after the third step.

11. The apparatus according to claim 10,
wherein a plasma of the second gas generated by the plasma generation high-frequency power includes deposition species.

12. The apparatus according to claim 10,
wherein a plasma of the third gas generated by the plasma generation high-frequency power includes etching species.

13. The apparatus according to claim 10,
wherein the second gas is a silane-based gas.

14. The apparatus according to claim 13,
wherein the second gas is a $SiH_4$ gas.

15. The apparatus according to claim 10,
wherein the third gas is a gas that contains fluorine.

16. The apparatus according to claim 15,
wherein the third gas is a $SiF_4$ gas.

17. The apparatus according to claim 10,
wherein the control unit is provided to control the processing gas supply system and the high-frequency power source to further execute:
a fifth step of terminating supplying of the second gas started in the fourth step while continuing supplying of the first gas started in the second step, supplying of the plasma generation high-frequency power started in the third step, and supplying of the third gas started in the fourth step, after the fourth step; and
a sixth step of terminating the supplying of the plasma generation high-frequency power started in the third step while continuing the supplying of the first gas started in the second step and the supplying of the third gas started in the fourth step, after the fifth step.

18. The apparatus according to claim 10,
wherein, in the third step, the supplying of the plasma generation high-frequency power and supplying ion drawing bias power to a placing table which supports the workpiece are started together, and
wherein the groove of the workpiece extends substantially in a vertical direction with respect to the main surface from the main surface of the workpiece.

\* \* \* \* \*